(12) United States Patent
Chang

(10) Patent No.: US 7,466,183 B2
(45) Date of Patent: Dec. 16, 2008

(54) LEVEL SHIFT CIRCUIT

(75) Inventor: Yu-Jui Chang, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 37 days.

(21) Appl. No.: 11/612,923

(22) Filed: Dec. 19, 2006

(65) Prior Publication Data

US 2008/0143409 A1    Jun. 19, 2008

(51) Int. Cl.
*H03L 5/00* (2006.01)
(52) U.S. Cl. .............................. 327/333; 326/62; 326/81
(58) Field of Classification Search ............. 326/62–64, 326/80–81; 327/306, 333
See application file for complete search history.

(56) References Cited

U.S. PATENT DOCUMENTS 7,230,475 B2 * 6/2007 Choi et al. .................. 327/544

* cited by examiner

*Primary Examiner*—Dinh T. Le
(74) *Attorney, Agent, or Firm*—J.C. Patents

(57) ABSTRACT

The present invention discloses a level shift circuit and a control pulse shaping unit therewith. A level shift circuit for transition of a low-voltage input signal into a high-voltage output signal, the circuit comprising two pairs of transistors and a control unit. Two pairs of transistors, wherein the transistors in one of the pairs are both turned on in response to the input signal so that a voltage on a reference voltage node is coupled to a gate of one of the transistors in the other pair; a control unit decoupling a reference voltage from the reference voltage node during a first phase, and partially and fully coupling the reference voltage to the reference voltage node respectively during a second and third phases.

18 Claims, 9 Drawing Sheets

LEVEL SHIFT CIRCUIT

BACKGROUND OF THE INVENTION

1. Field of Invention

The present invention generally relates to a level shift circuit and a control pulse shaping unit, and more particularly to a level shift circuit and a control pulse shaping unit in a source driver of LCD.

2. Description of Related Art

FIG. 1 is a circuit diagram of a conventional level shift circuit 100. The level shift 100 includes a plurality of transistors 101~105. A low-voltage signal IN1 is inputted to the gate of the transistor 104 and an inverted low-voltage signal INB1 is inputted to the gate of the transistor 105. The transistor 104 and the transistor 105 are electrically connected to the transistor 102 and the transistor 103, respectively. The transistor 102 and the transistor 103 are cross-coupled to each other and are formed similar as clamping transistors. A control signal CTRL0 is inputted to a gate of the transistor 101. A voltage VDDA is coupled to the transistor 101 and a voltage VSSA is coupled the transistors 104,105. The transistors 102,103 are commonly coupled to a node n1. The node n1 includes voltage V1. The transistor 103 outputs a high-voltage signal OD51 and the transistor 102 outputs an inverted high-voltage signal ODB51.

FIG. 2 shows the signals in the level shift circuit 100 upon transition of the input signal IN1 from a high to a low logic state. The transition starts from the time T21. At time T21, the control signal CTRL0 goes high to turn off the transistor 101 so that the voltage V1 drops. The transistor 102 is turned on and couples the voltage V1 to its drain. Since the voltage level of the signal ODB51 should be high enough to turn off the transistor 103, the control signal CTRL0 slightly drops at time T22 to partially turn on the transistor 101 so that the levels of the voltage V1 and signal ODB51 start to rise at time T22. However, the level of the signal ODB51 will not rise to a level high enough to fully turn off the transistor 103 at the end of the transition (at time T23) if the level of the input signal IN1 is too low. For such a low input signal, when the control signal CTRL0 turns on the transistor 101, the partially turned on transistor 103 couples a high voltage to its drain, which turns off the transistor 102 and keeps the signal ODB51 stay at a relatively low level. Thus, the transistor 103 is turned on and the signal OD51 is pulled high, which means that the transition fails.

SUMMARY OF THE INVENTION

An objective of the present invention is to provide a level shift circuit for conversion of a low-voltage input signal into a high-voltage output signal, which prevents failure of transition due to lower voltage input.

Another objective of the present invention is to provide a control pulse shaping unit for generation of a control pulse, which prevents failure of transition due to lower voltage input.

Still another objective of the present invention is to provide a control pulse shaping unit for generation of a control pulse, which prevents failure of transition due to lower voltage input.

Still another object of the present invention is to provide a method for transition of a low-voltage input signal into a high-voltage output signal, which prevents failure of transition due to lower voltage input.

This invention provides a level shift circuit for transition of a low-voltage input signal into a high-voltage output signal, the circuit comprising two pairs of transistors and a control unit. The transistors in one of the pairs are both turned on in response to the input signal so that a voltage on a reference voltage node is coupled to a gate of one of the transistors in the other pair. The control unit decouples a reference voltage from the reference voltage node during a first phase, and partially and fully couples the reference voltage to the reference voltage node respectively during a second and third phases.

In accordance with a preferred embodiment of the present invention, the control unit comprises a control pulse shaping unit and a first transistor. The control pulse shaping unit generates a control signal and the first transistor has a source electrically connected to a first reference voltage, a gate electrically connected to receive the control signal, and a drain electrically connected to the reference voltage node. The control signal has a first, second and third voltage levels during the first, second and third phases so that the first transistor is turned off, partially turned on and fully turned on during the first, second and third phases, respectively.

The present invention further provides a control shaping unit. The control shaping unit comprises a first transistor, a second transistor, a third transistor, a fourth transistor, a fifth transistor, and a sixth transistor. The first transistor has a source electrically connected to a first reference voltage, a gate connected to a second reference voltage, and a drain. The second transistor has a drain electrically connected to the drain of the first transistor, a gate receiving a first enable signal, and a source. The third transistor has a source electrically connected to a third reference voltage, a drain electrically connected to the source of the second transistor, and a source, wherein the gate and the drain of the third transistor connect to each other. The fourth transistor has a drain electrically connected to the gate of the third transistor, a gate receiving the first enable signal, and a source. The fifth transistor has a source electrically connected to the third reference voltage, a gate receiving a second enable signal, and a drain electrically connected to the source of the fourth transistor. The sixth transistor has a source electrically connected to a fourth reference voltage, a gate receiving a third enable signal, and a drain electrically connected to the drain of the fifth transistor, wherein the drain of the sixth transistor outputs a control signal.

The present invention further provides a first transistor, a second transistor, a third transistor, a fourth transistor, a fifth transistor, and a sixth transistor. The first transistor has a source electrically connected to a first reference voltage, a gate receiving a first enable signal, and a drain. The second transistor has a drain electrically connected to the drain of the first transistor, a source electrically connected to a second reference voltage, and a gate. The third transistor has a source electrically connected to the second reference voltage, a drain electrically connected to the gate of the second transistor, and a source receiving a second enable signal. The fourth transistor has a drain electrically connected to the gate of the third transistor, a gate receiving a third enable signal, and a source connected to the drain of the second transistor. The fifth transistor has a source electrically connected to the second reference voltage, a gate receiving a fourth enable signal, and a drain electrically connected to the source of the fourth transistor. The sixth transistor has a source electrically connected to the first reference voltage, a gate receiving a fifth enable signal, and a drain electrically connected to the drain of the fifth transistor, wherein a control signal is output from the drain of the sixth transistor.

The present invention further provides a method for transition of a low-voltage input signal into a high-voltage output signal using at least two pairs of transistors wherein the transistors in one of the pairs are both turned on in response to the input signal so that a voltage on a reference voltage node is coupled to a gate of one of the transistors in the other pair. The method comprises the steps of: decoupling a reference voltage from the reference voltage node during a first phase, and partially and fully coupling the reference voltage to the reference voltage node respectively during a second and third phases.

In the present invention, as the control unit decouples a reference voltage from the reference voltage node during a first phase, and partially and fully couples the reference voltage to the reference voltage node respectively during a second and third phases, the level shift circuit prevents failure of transition due to lower voltage input.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification.

DESCRIPTION OF EMBODIMENTS

Figure 1:
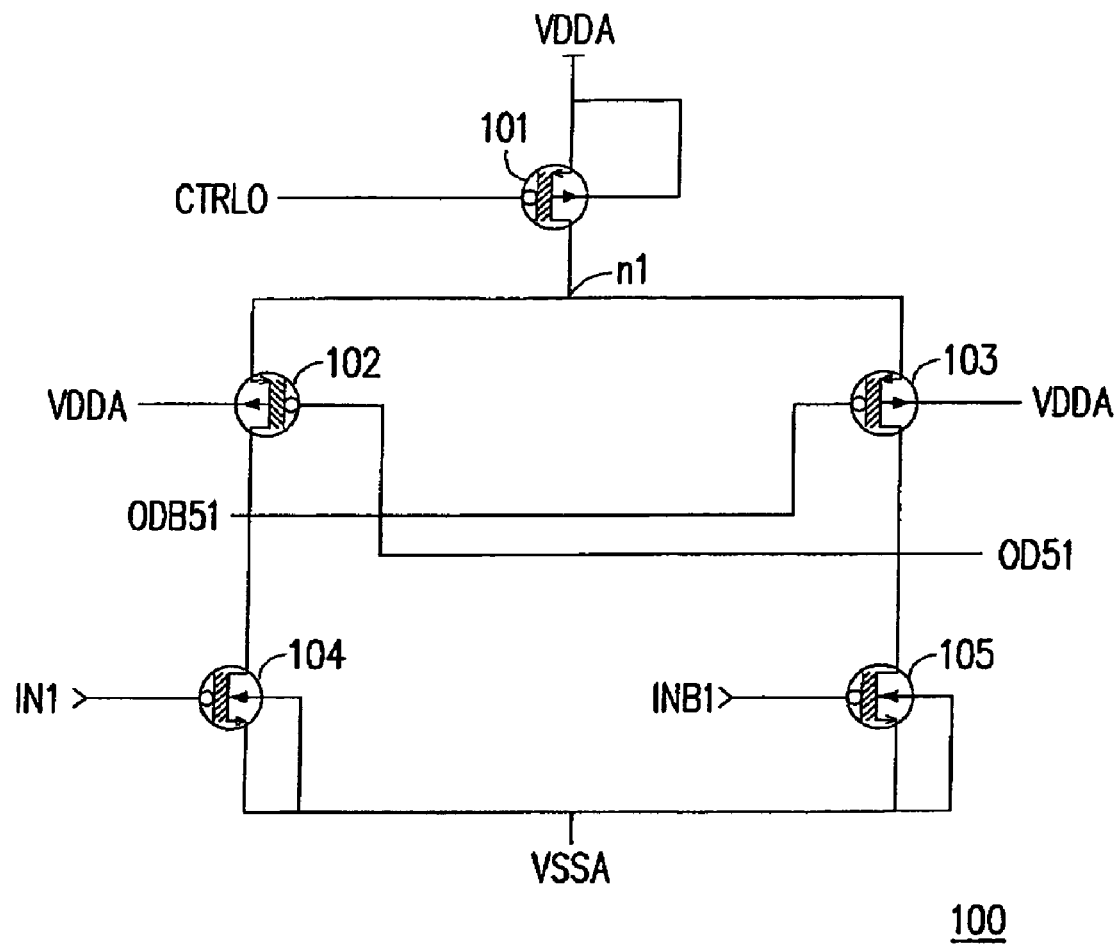
FIG. 1 is a circuit diagram of a conventional level shift circuit 100.
Figure 2:
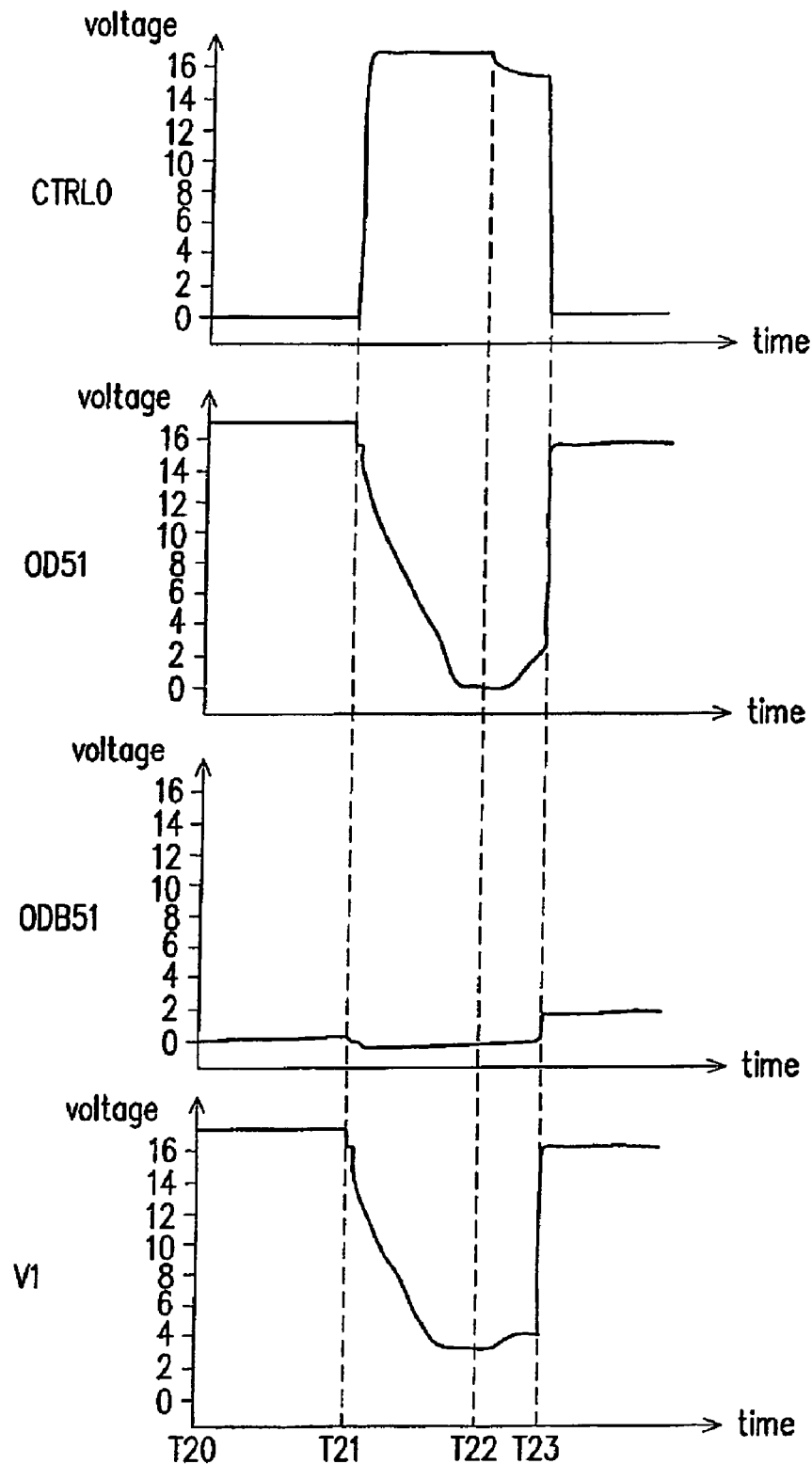
FIG. 2 shows the signals in the level shift circuit 100 upon transition of the input signal IN1 from a high to a low logic state.

The present invention will now be described with reference to the accompanying drawings, in which exemplary embodiments of the invention are shown. The invention may, however, be embodied in many different forms and should not be construed as being limited to the embodiments set forth herein. Furthermore, the embodiments are provided so that this disclosure will be thorough and complete, and will fully convey the concept of the invention to those skilled in the art.

In the drawings, whenever the same element reappears in subsequent drawings, it is denoted by the same reference numeral.

Figure 3:
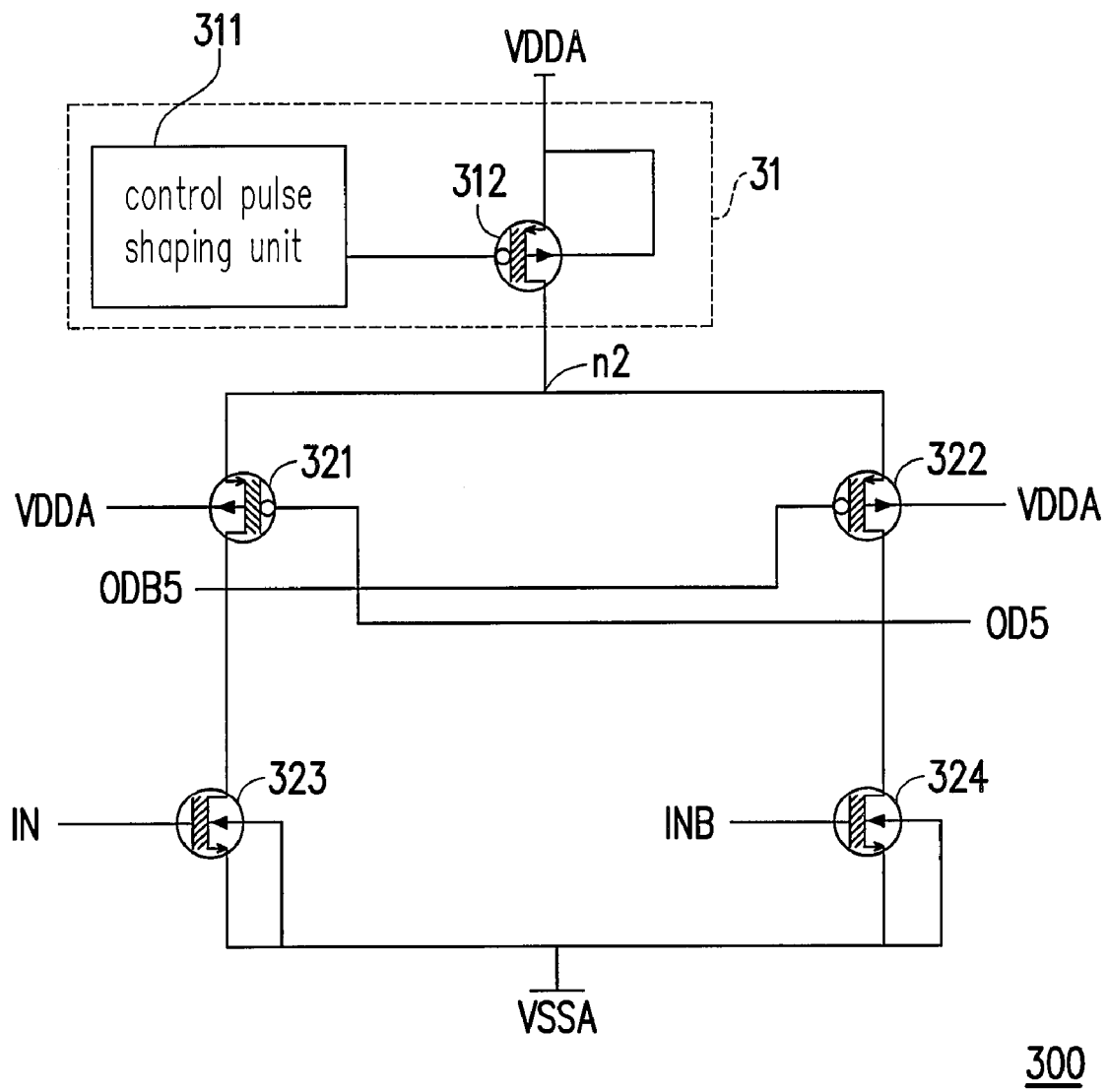
FIG. 3 is a circuit diagram of a level shift circuit 300 according to the embodiment of the present invention.

FIG. 3 is a circuit diagram of a level shift circuit 300 according to the embodiment of the present invention. The level shift circuit 300 converts a low-voltage input signal into a high-voltage output signal. For instance, a low-voltage input signal refers to a signal having a dynamic range from 0 volt to 2.3 volts while a high-voltage output signal refers to a signal having a dynamic range from 0 volt to 20 volts. Those skilled in the art should understand that the dynamics ranges of the low-voltage input signal and the high-voltage output signal are not limited to those described above.

The level shift circuit includes a control unit 31 and a first pair of transistor 321 and 324, and a second pair of transistors 322 and 323. The control unit 31 includes a control pulse shaping unit 311 and a transistor 312. The transistors 312, 321,322 are PMOS transistors, and the transistors 323,324 are NMOS transistors. The transistors on the first or second pair are both turned on in response to the input signal IN so that a voltage on a reference voltage node n2 is couple to a gate of the upper transistor 331 or 332 in the other pair. More specially, when the state of the low-voltage input signal IN is high and the inverted low-voltage input signal INB is low, the transistors 322, 323 are both turned on so that a voltage V2 on the reference voltage node n2 is coupled to the gate of the transistor 321. When the state of the low-voltage input signal IN is low and the inverted low-voltage signal INB is high, the transistors 321, 324 are both turned on so that the voltage V2 on the reference voltage node n2 is coupled to the gate of the transistors 322.

The control pulse shaping unit 311 generates a control signal. In addition, the transistor 312 has a source electrically connected to a first reference voltage VDDA, a gate electrically connected to receive the control signal, and a drain electrically connected to the reference voltage node n2. The transistor 312 has a source electrically connected to a reference voltage VDDA, a gate for receiving the control signal CTRL, and a drain electrically connected to the reference voltage node n2. A source of the transistor 321 and a source of the transistor 322 are electrically connected to the drain of the transistor 312, a gate of the transistor 321 is electrically connected to a drain of the transistor 322, and a gate of the transistor 322 is electrically connected to a drain of the transistor 321. A source of the transistor 323 and a source of the transistor 324 are electrically connected to the reference voltage VSSA. A drain of the transistor 323 is electrically connected to the drain of the transistor 321. A drain of the transistor 324 is electrically connected to the drain of the transistor 322.

Figure 4:
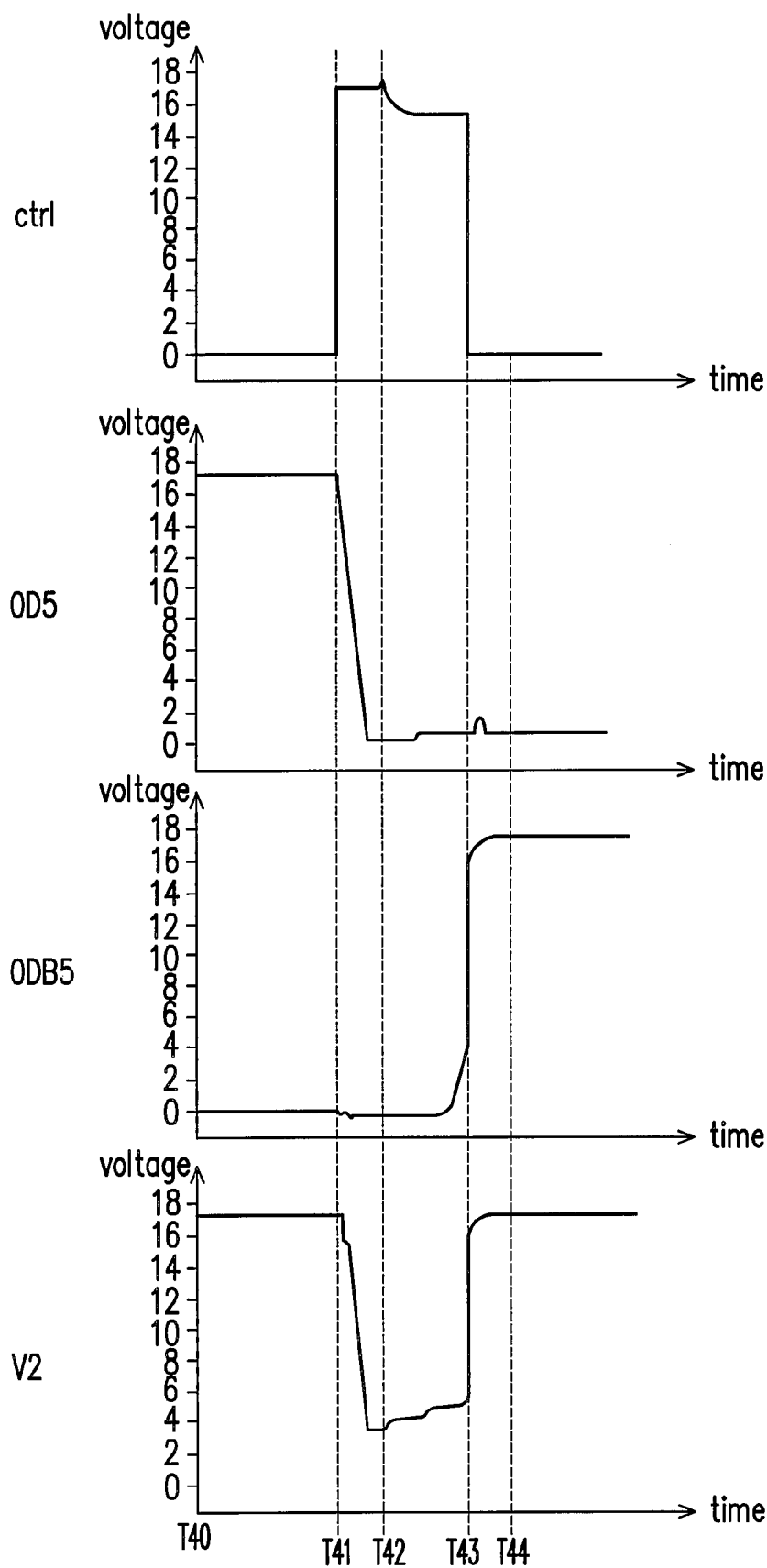
FIG. 4 shows the signals in the level shift circuit 300 upon the transition of the input signal IN from a high to low logic state.

FIG. 4 shows the signals in the level shift circuit 300 upon the transition of the input signal IN from a high to low logic state. Referring to FIG. 3 and FIG. 4, the control unit 31 decouples a reference voltage from the reference voltage node during a first phase, and partially and fully couples the reference voltage to the reference voltage node respectively during a second and third phases. Then, the control signal has a first, second and third voltage levels during the first, second and third phases so that the transistor 312 is turned off, partially turned on and fully turned on during the first, second and third phases, respectively. For instance, the first phase may be the duration when a level of the control signal ctrl is high. The period from time T41 to time T42 is the duration of the first phase. The second phase may be the duration when a level of the first control signal ctrl is in the middle voltage. The period from time T42 to time T43 is the duration of the second phase. The third phase may be the duration when a level of the first control signal ctrl is high. The period from time T43 to time T44 is the duration of the third phase.

FIG. 4 shows the signals in the level shift circuit 300 upon the transition of the input signal IN from a high to low logic state. The transition starts from the time T41. The control unit 31 decouples the reference voltage VDDA from the reference voltage node n2 in response to a high logic state of the signal ctrl generated from the charging shaping unit during a transition phase from time T41 to T44, and couples the reference voltage VDDA to the reference voltage node n2 in response to a low logic state of the signal ctrl generated from the charging shaping unit during a driving phase beyond the transition phase. The control signal ctrl slightly drops at time T42 to partially turn on the transistor 312. More specially, the control voltage forms as a shaping curve to slowly partially turn on the transistor 312 from time T42 to time T43. Then, the voltage of the inverted high-voltage output signal OD5 is increasing from T43 to time T44. Hence, the inverted high-voltage output signal ODB5 goes high after time T44. Then the inverted high-voltage output signal OD5 goes low. As a result, the transition of a low-voltage input signal into a high-voltage output signal is successful.

Figure 5:
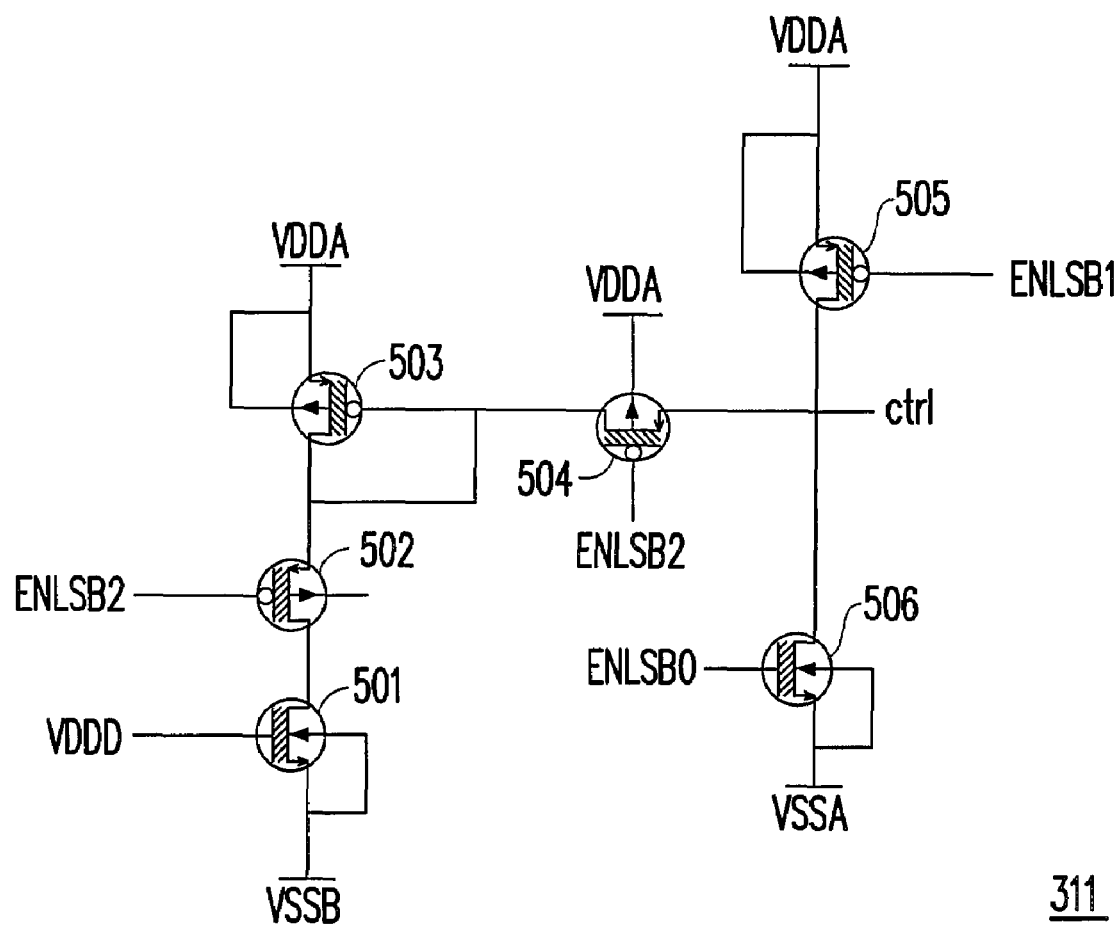
FIG. 5 is a circuit diagram of a control pulse shaping unit 311 illustrated in FIG. 3 according to the embodiment of the present invention.

FIG. 5 is a circuit diagram of a control pulse shaping unit 311 illustrated in FIG. 3 according to the embodiment of the present invention. The control pulse shaping unit is to produce a control signal for partially turning on the transistor 311 from T42 to time T43. Hence, the control pulse herein the control pulse shaping unit comprises a plurality of transistors 501~506. The transistor 501 has a source electrically connected to a third reference voltage VSSB, a gate connected to a fourth reference voltage VDDD, and a drain. The transistor 502 has a drain electrically connected to the drain of the transistor 501, a gate receiving a first enable signal ENLSB2, and a source. The transistor 503 has a source electrically connected to the second reference voltage, a drain electrically connected to the source of the transistor 502, and a gate, wherein the gate and the drain of the, transistor 503 connected to each other. The transistor 504 has a drain electrically connected to the gate of the transistor 503, a gate receiving the first enable signal ENLSB2, and a source. The transistor 505 has a source electrically connected to the second reference voltage VDDA, a gate receiving a second enable signal ENLSB1, and a drain electrically connected to the source of the transistor 504. The transistor 506 has a source electrically connected to the first reference voltage VSSA, a gate receiving a third enable signal ENLSB, and a drain electrically connected to the drain of the transistor 505, wherein the control signal ctrl is output from the drain of the transistor 506.

Figure 6:
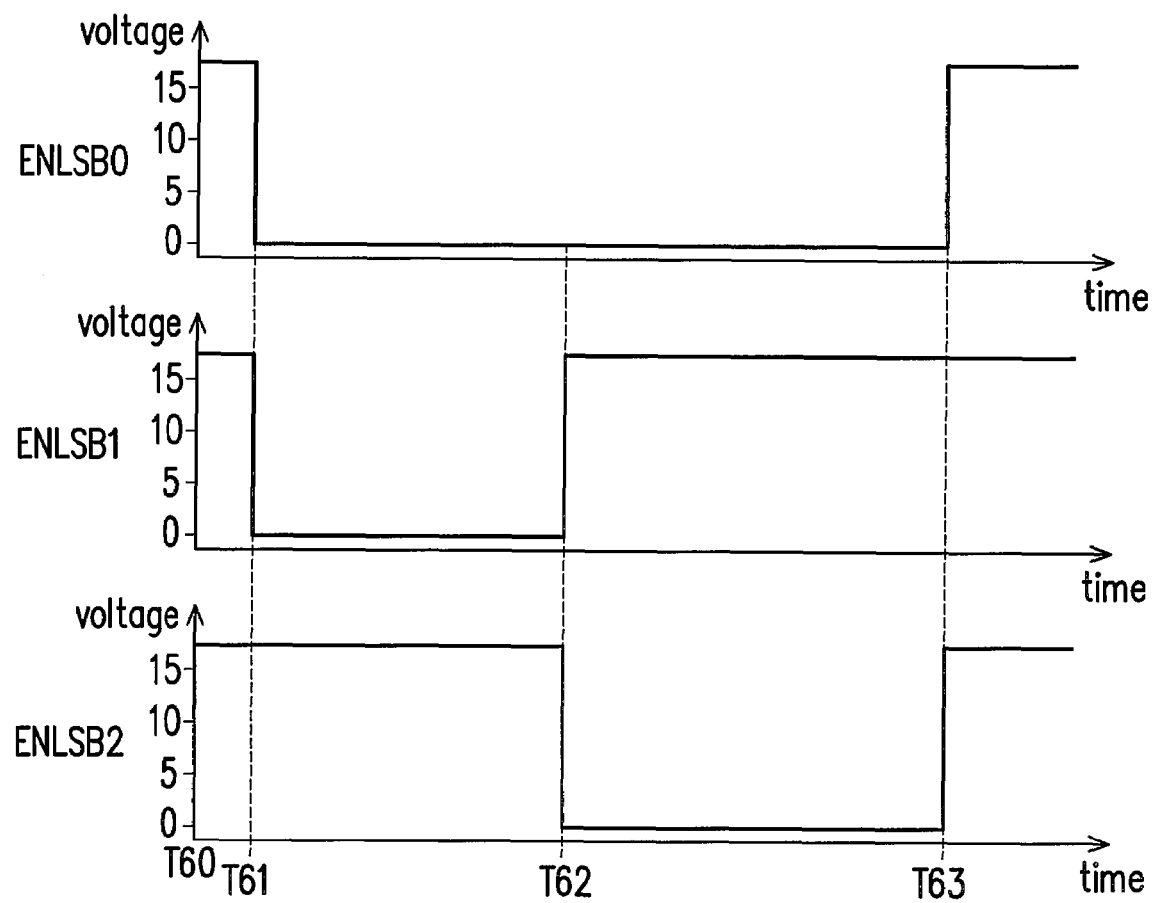
FIG. 6 shows the signals in the control pulse shaping unit 311 illustrated in FIG. 5.

FIG. 6 shows the signals in the control pulse shaping unit 311 illustrated in FIG. 5. Referring to FIG. 5 and FIG. 6, the enable signal ENLSB0, ENLSB1, and ENLSB2 is remaining high from time T60 to time T61. The enable signal ENLSB1 goes low to turn on the transistor 505 and the enable signal ENLSB0 goes low to turn off the transistor 506 at time T62. Thus, the control signal ctrl goes high and turns off the transistor 312 of FIG. 3. The enable signal ENLSB1 goes low to turn off the transistor 505 and the enable signal ENLSB2 turns on the plurality of transistors 502,504 from time T62 to time T63. Hence, the control signal ctrl is not affected by the plurality of transistors 505,506. As a result, the control signal ctrl to partially turn on the transistors 312 of FIG. 3. The enable signal ENLSB0 is high to turn on the transistor 506 at time T63. Then, the control signal ctrl goes low to fully turn on the transistor 312 of FIG. 3. As a result, the transition of a low-voltage input signal into a high-voltage output signal is successful.

Figure 7:
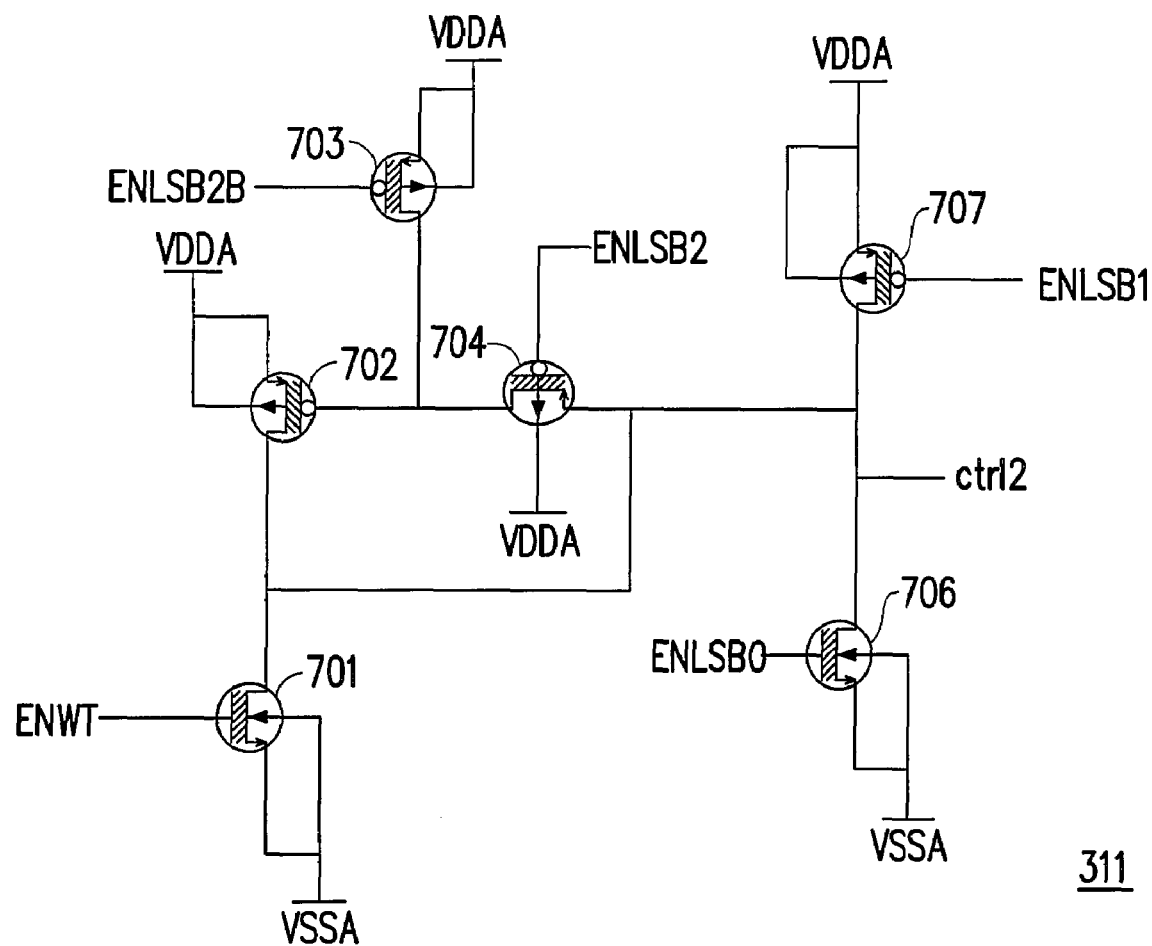
FIG. 7 is another circuit diagram of a control pulse shaping unit 311 illustrated in FIG. 3 according to the embodiment of the present invention.

FIG. 7 is another circuit diagram of a control pulse shaping unit 311 illustrated in FIG. 3 according to the embodiment of the present invention. Different from FIG. 5, FIG. 7 provides another structure to constitute the control pulse shaping unit 311. The control pulse shaping unit comprises transistors 701~704, and 706~707. The transistor 701 has a source electrically connected to a voltage VSSA, a gate receiving an enable signal ENWT, and a drain. The transistor 702 has a drain electrically connected to the drain of the transistor 701, a source electrically connected to a sixth reference voltage, and a gate. The transistor 703 has a source electrically connected to the reference voltage VDDA, a drain electrically connected to the gate of the transistor 702, and a gate receiving an enable signal ENLSB2B. The transistor 704 has a drain electrically connected to the gate of the transistor 702, a gate receiving the enable signal ENLSB2, and a source connected to the drain of the transistor 702. A transistor 706 has a source electrically connected to the voltage VSSA, a gate receiving the enable signal ENLSB0, and a drain electrically connected to the drain of the transistor 707, wherein the control signal ctrl2 is output from the drain of the transistor 706. A transistor 707 has a source electrically connected to the sixth voltage VDDA, a gate receiving an enable signal ENLSB1, and a drain electrically connected to the source of the transistor 704. The transistors 701, 706 are NMOS transistors, and the transistors 702~704, 707 are PMOS transistors. The voltage VDDA is higher than voltage VSSA.

Figure 8:
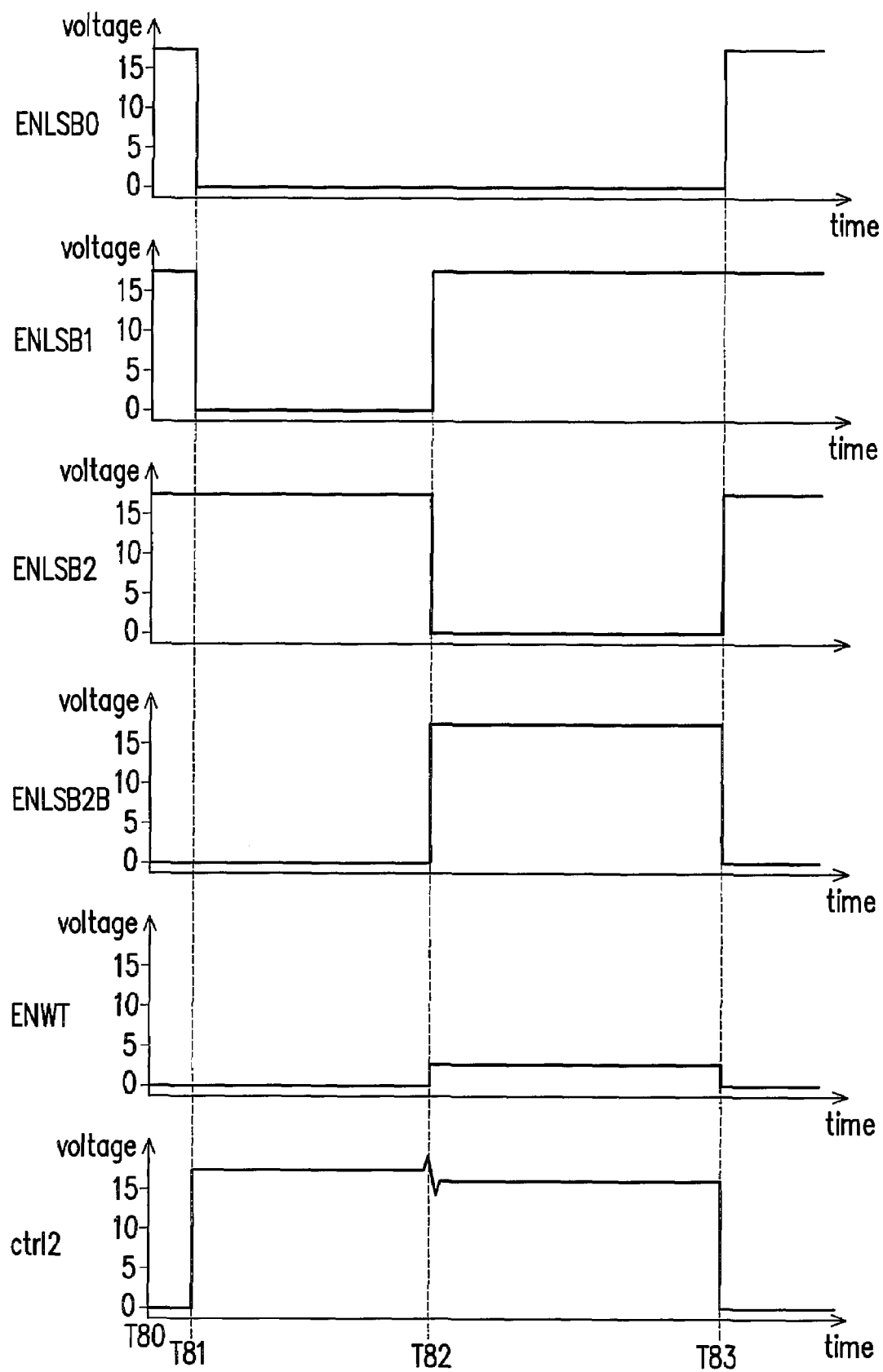
FIG. 8 shows the signals in the control pulse shaping unit 311 illustrated in FIG. 7.

FIG. 8 shows the signals in the control pulse shaping unit 311 illustrated in FIG. 7. Referring to FIG. 7 and FIG.8, the enable signal ENLSB0, ENLSB1, and ENLSB2 is remaining high from time T80 to time T81. The enable signal ENLSB1 goes low to turn on the transistor 707 and the enable signal ENLSB0 goes low to turn off the transistor 706 at time T82. Thus, the control signal ctrl goes high and turns off the transistor 312 of FIG. 3. The enable signal ENLSB1 goes low to turn off the transistor 505 and the enable signal ENLSB2 turns on the plurality of transistors 502, 504 from time T62 to time T63. Hence, the control signal ctrl2 is not affected by the plurality of transistors 505, 506. Thus, the enable signal ENLSB2B turns on the transistor 703 and the enable signal ENWT partially turns on the transistor. As a result, the control signal ctrl2 to partially turn on the transistors 312 of FIG. 3. The enable signal ENLSB0 is high to turn on the transistor 706 at time T83. Then, the control signal ctrl2 goes low to fully turn on the transistor 312 of FIG. 3. As a result, the transition of a low-voltage input signal into a high-voltage output signal is successful.

Figure 9:
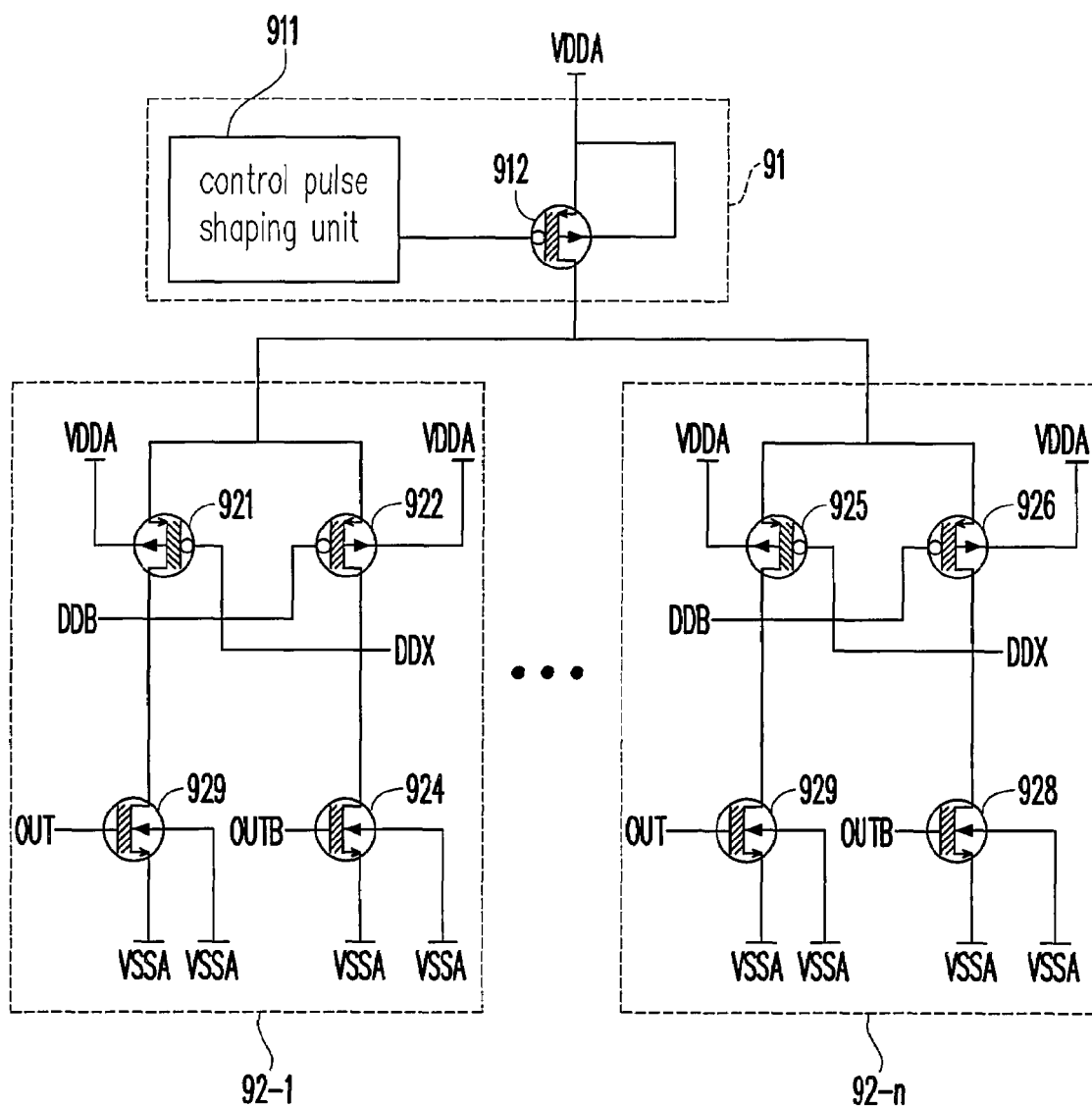
FIG. 9 is a circuit diagram of a level shift circuit according to another embodiment of the present invention.

FIG. 9 is a circuit diagram of a level shift circuit according to another embodiment of the present invention. A level shift circuit concludes control unit 91 and a plurality of output units 92-1~192-n. The control unit 91 concludes control pulse shaping unit 91 and transistor 912. The control unit 91 controls the polarity of output units 92-1 (not shown), 92-2 (not shown), 92-3 (not shown), 92-4 (not shown), 92-5 (not shown) . . . 92-n. The transistors 921,922 forms as a clamping pair and the transistors 925,926 form as a clamping pair. The transistor 929 receives the input signal OUT. The transistors 924,928 receive the low-voltage input signal OUTB. Then, the output unit 92-1~92-n generates high-voltage output signal DDB,DDX. The control unit 91 is shared by 92-1 (not shown), 92-2 (not shown), 92-3 (not shown), 92-4 (not shown), 92-5 (not shown) . . . 92-n, thereby reducing the chip area.

To sum up, as the control unit decouples a reference voltage from the reference voltage node during a first phase, and partially and fully couples the reference voltage to the reference voltage node respectively during a second and third phases, the level shift circuit prevents failure of transition due to lower voltage input.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A level shift circuit for conversion of a low-voltage input signal into a high-voltage output signal, the circuit comprising:
   two pairs of transistors, having an input node for receiving the low-voltage input signal, an output node for outputting the high-voltage signal, and a reference voltage node; and
   a control unit, comprising:
      a first transistor having a source electrically connected to a first reference voltage, a gate electrically connected to receive a control signal, and a drain electrically connected to the reference voltage node; and
      a control pulse shape unit generating a control signal for controlling the first transistor to decouple the first reference voltage from the reference voltage node during a first phase, and partially and fully couple the first reference voltage to the reference voltage node respectively during a second and third phases.

2. The level shift circuit as claimed in claim 1, wherein the control signal has a first, second and third voltage levels during the first, second and third phases so that the first transistor is turned off, partially turned on and fully turned on during the first, second and third phases, respectively.

3. The level shift circuit as claimed in claim 1, wherein the transistors comprises:
   a second transistor and a third transistor, wherein a source of the second transistor and a source of the third transistor are electrically connected to the reference voltage node, a gate of the second transistor is electrically connected to a drain of the third transistor, and a gate of the third transistor is electrically connected to a drain of the second transistor; and
   a fourth transistor and a fifth transistor, wherein a source of the fourth transistor and a source of the fifth transistor are electrically connected to receive a second reference voltage, a drain of the fourth transistor is electrically connected to the drain of the second transistor, and a drain of the filth transistor is electrically connected to the drain of the third transistor.

4. The level shift circuit as claimed in claim 1, wherein the control pulse shaping unit comprises:
   a sixth transistor having a source electrically connected to a third reference voltage, a gate connected to a fourth reference voltage, and a drain;
   a seventh transistor having a drain electrically connected to the drain of the sixth transistor, a gate receiving a first enable signal, and a source;
   an eighth transistor having a source electrically connected to the second reference voltage, a drain electrically connected to the source of the seventh transistor, and a gate, wherein the gate and the drain of the eighth transistor connected to each other;
   a ninth transistor having a drain electrically connected to the gate of the eighth transistor, a gate receiving the first enable signal, and a source;
   a tenth transistor having a source electrically connected to the second reference voltage, a gate receiving a second enable signal, and a drain electrically connected to the source of the ninth transistor; and
   a eleventh transistor having a source electrically connected to the first reference voltage, a gate receiving a third enable signal, and a drain electrically connected to the drain of the tenth transistor, wherein the control signal is output from the drain of the eleventh transistor.

5. The level shift circuit as claimed in claim 4, wherein the fourth, fifth, sixth and eleventh transistors are NMOS transistors, and the first, second, third, seventh, eighth, ninth and tenth transistors are PMOS transistors.

6. The level shift circuit as claimed in claim 4, wherein the first reference voltage is higher than the second reference voltage.

7. The level shift circuit as claimed in claim 1, wherein the control pulse shaping unit comprises:
   a twelfth transistor having a source electrically connected to a fifth reference voltage, a gate receiving a forth enable signal, and a drain;
   a thirteenth transistor having a drain electrically connected to the drain of the twelfth transistor, a source electrically connected to a sixth reference voltage, and a gate;
   a fortieth transistor having a source electrically connected to the sixth reference voltage, a drain electrically connected to the gate of the thirteenth transistor, and a gate receiving a fifth enable signal;
   a fifteenth transistor having a drain electrically connected to the gate of the thirteenth transistor, a gate receiving a sixth enable signal, and a source connected to the drain of the thirteenth transistor;
   a sixteenth transistor having a source electrically connected to the sixth reference voltage, a gate receiving a seventh enable signal, and a drain electrically connected to the source of the fifteenth transistor; and
   a seventeenth transistor having a source electrically connected to the fifth reference voltage, a gate receiving a eight enable signal, and a drain electrically connected to the drain of the sixteenth transistor, wherein the control signal is output from the drain of the seventeenth transistor.

8. The level shift circuit as claimed in claim 7, wherein the fourth, fifth, twelfth and seventeenth transistors are NMOS transistors, and the first, second, third, thirteenth, fortieth, fifteenth and sixteenth transistors are PMOS transistors.

9. The level shift circuit as claimed in claim 4, wherein the third reference voltage is higher than the fourth reference voltage.

10. A method for conversion of a low-voltage input signal into a high-voltage output signal using at least two pairs of transistors having an input node for receiving the low-voltage input signal, an output node for outputting the high-voltage signal, and a reference voltage node, the method comprising the steps of:
    utilizing a control pulse shaping unit to generate a control signal; and
    controlling a fifth transistor, having a source electrically connected to a second reference voltage, a sate electrically connected to receive the control signal and a drain electrically connected to the reference voltage node, according the control signal for decoupling the second reference voltage from the reference voltage node during a first phase, and partially and fully coupling the second reference voltage to the reference voltage node respectively during a second and third phases.

11. The method as claimed in claim 10, wherein the transistors comprises:
    a first transistor and a second transistor, wherein a source of the first transistor and a source of the second transistor are electrically connected to the reference voltage node, a gate of the first transistor is electrically connected to a drain of the second transistor, and a gate of the second transistor is electrically connected to a drain of the first transistor; and a third transistor and a fourth transistor, wherein a source of the third transistor and a source of the fourth transistor are electrically connected to receive a first reference voltage, a drain of the third transistor is electrically connected to the drain of the first transistor, and a drain of the fourth transistor is electrically connected to the drain of the second transistor.

12. The method as claimed in claim 10, wherein the control signal has a first, second and third voltage levels during the first, second and third phases so that the fifth transistor is turned off, partially turned on and fully turned on during the first, second and third phases, respectively.

13. The method as claimed in claim 10, wherein the control pulse shaping unit comprises:
- a sixth transistor having a source electrically connected to a third reference voltage, a gate connected to a fourth reference voltage, and a drain;
- a seventh transistor having a drain electrically connected to the drain of the sixth transistor, a gate receiving a first enable signal, and a source;
- an eighth transistor having a source electrically connected to the second reference voltage, a drain electrically connected to the source of the seventh transistor, and a gate, wherein the gate and the drain of the eighth transistor connected to each other;
- a ninth transistor having a drain electrically connected to the gate of the eighth transistor, a gate receiving the first enable signal, and a source;
- a tenth transistor having a source electrically connected to the second reference voltage, a gate receiving a second enable signal, and a drain electrically connected to the source of the ninth transistor; and
- a eleventh transistor having a source electrically connected to the first reference voltage, a gate receiving a third enable signal, and a drain electrically connected to the drain of the tenth transistor, wherein the control signal is output from the drain of the eleventh transistor.

14. The method as claimed in claim 13, wherein the third, fourth, sixth and eleventh transistors are NMOS transistors, and the first, second, fifth, seventh, eighth, ninth and tenth transistors are PMOS transistors.

15. The method as claimed in claim 13, wherein the first reference voltage is higher than the second reference voltage.

16. The method as claimed in claim 10, wherein the control pulse shaping unit comprises:
- a twelfth transistor having a source electrically connected to a fifth reference voltage, a gate receiving a forth enable signal, and a drain;
- a thirteenth transistor having a drain electrically connected to the drain of the twelfth transistor, a source electrically connected to a sixth reference voltage, and a gate;
- a fortieth transistor having a source electrically connected to the sixth reference voltage, a drain electrically connected to the gate of the thirteenth transistor, and a gate receiving a fifth enable signal;
- a fifteenth transistor having a drain electrically connected to the gate of the thirteenth transistor, a gate receiving a sixth enable signal, and a source connected to the drain of the thirteenth transistor;
- a sixteenth transistor having a source electrically connected to the sixth reference voltage, a gate receiving a seventh enable signal, and a drain electrically connected to the source of the fifteenth transistor; and
- a seventeenth transistor having a source electrically connected to the fifth reference voltage, a gate receiving a eight enable signal, and a drain electrically connected to the drain of the sixteenth transistor, wherein the control signal is output from the drain of the seventeenth transistor.

17. The method as claimed in claim 16, wherein the fourth, fifth, twelfth and seventeenth transistors are NMOS transistors, and the first, second, third, thirteenth, fortieth, fifteenth and sixteenth transistors are PMOS transistors.

18. The method as claimed in claim 13, wherein the third reference voltage is higher than the fourth reference voltage.

* * * * *